US012720673B2

(12) United States Patent
Go et al.

(10) Patent No.: US 12,720,673 B2
(45) Date of Patent: Aug. 25, 2026

(54) METHODS AND APPARATUS TO INCREASE RIGIDITY OF PRINTED CIRCUIT BOARDS

(71) Applicant: Intel Corporation, Santa Clara, CA (US)

(72) Inventors: Jia Yan Go, Kulim (MY); Tin Poay Chuah, Bayan Baru (MY); Juha Paavola, Hillsboro, OR (US); Twan Sing Loo, Butterworth (MY); Sami Heinisuo, Dallas, OR (US); Kari Mansukoski, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 18/060,432

(22) Filed: Nov. 30, 2022

(65) Prior Publication Data

US 2023/0108868 A1 Apr. 6, 2023

(51) Int. Cl.

*H05K 3/46* (2006.01)
*H05K 1/02* (2006.01)
*H05K 1/11* (2006.01)

(52) U.S. Cl.

CPC ......... *H05K 1/0271* (2013.01); *H05K 1/0218* (2013.01); *H05K 1/115* (2013.01); *H05K 3/46* (2013.01)

(58) Field of Classification Search

CPC .... H05K 1/0271; H05K 1/0218; H05K 1/115; H05K 3/46; H05K 7/1461
USPC .......................................................... 174/255
See application file for complete search history.

(56) References Cited

U.S. PATENT DOCUMENTS

| | | | | |
|---|---|---|---|---|
| 6,313,521 | B1 | 11/2001 | Baba | |
| 6,317,330 | B1 * | 11/2001 | Portman | H05K 7/1461 439/74 |
| 9,867,282 | B2 * | 1/2018 | Hu | H05K 1/0271 |
| 2001/0017408 | A1 | 8/2001 | Baba | |
| 2004/0150118 | A1 | 8/2004 | Honda | |
| 2004/0253842 | A1 * | 12/2004 | Barsun | H05K 7/1439 439/59 |
| 2013/0258619 | A1 * | 10/2013 | Ley | H05K 7/1461 29/829 |
| 2015/0049441 | A1 * | 2/2015 | Hu | H05K 1/0271 174/250 |
| 2016/0205778 | A1 * | 7/2016 | Lin | H05K 1/112 29/829 |
| 2022/0217848 | A1 | 7/2022 | Paavola et al. | |

* cited by examiner

*Primary Examiner* — Timothy J Thompson
*Assistant Examiner* — Michael F McAllister
(74) *Attorney, Agent, or Firm* — Hanley, Flight & Zimmerman, LLC

(57) ABSTRACT

Methods, apparatus, systems, and articles of manufacture to increase rigidity of printed circuit boards are disclosed. An apparatus includes a stack of insulative layers. The stack includes a first face and a second face opposite the first face. The apparatus further includes a plurality of conductive layers. Ones of the conductive layers between adjacent ones of the insulative layers. The apparatus also includes a metal stiffener extending along a perimeter of a first one of the insulative layers. The metal stiffener has a thickness measured in a direction perpendicular to the first face. The thickness is less than a distance between the first and second faces.

21 Claims, 8 Drawing Sheets

500
504
502
504

500
504
504

500
330
330
336
336

500
802
802
330
330
802
802

METHODS AND APPARATUS TO INCREASE RIGIDITY OF PRINTED CIRCUIT BOARDS

FIELD OF THE DISCLOSURE

This disclosure relates generally to printed circuit boards and, more particularly, to methods and apparatus to increase rigidity of printed circuit boards.

BACKGROUND

Electronic devices continue to decrease in size and weight. One way in which smaller and lighter electronic devices are achieved is by reducing the thickness of printed circuit boards (PCBs) the support and connect different electrical components. However, thinner PCBs are less rigid and more fragile and, therefore, more likely to warp and/or break during PCB manufacturing, component soldering processes, final product assembly, and/or during use of the product.

Figure 1:
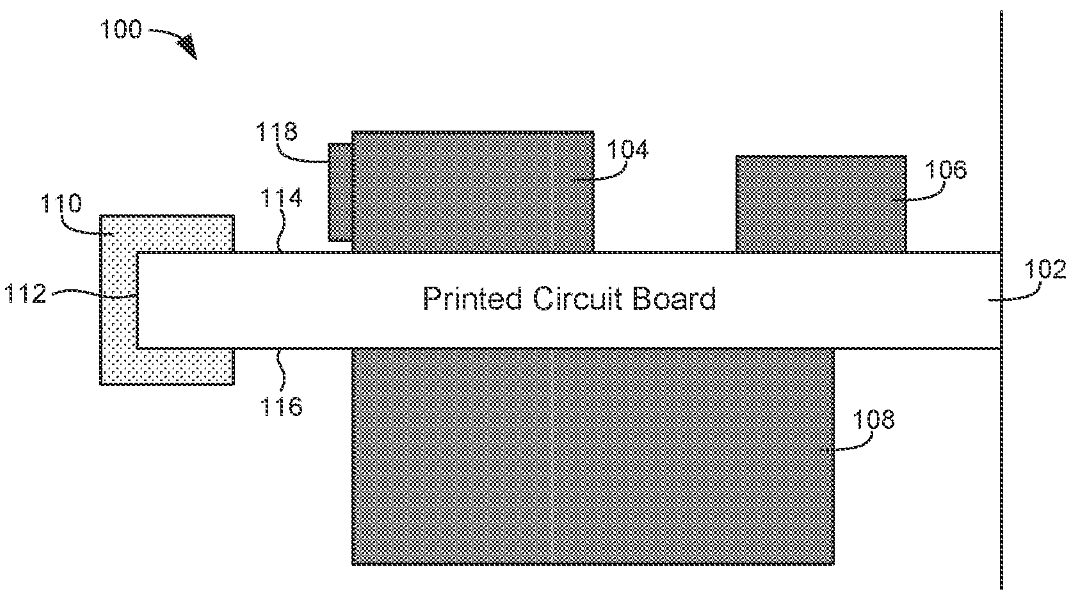
FIG. 1 is a cross-sectional view of a portion of a known PCB assembly.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

For many applications in the printed circuit board (PCB) industries, thin PCBs are required due to the system Z reduction (e.g., reduction in thickness in a direction normal to a primary plane of a PCB) to achieve thin and light system specifications. However, as PCBs become thinner, they also become less rigid and/or stiff, which can lead to problems in subsequent manufacturing and/or component assembly processes.

Internal stress in PCBs can arise during the manufacture of PCBs and subsequent assembly with other components due to the expansion and shrinkage of materials arising from changes in temperatures associated with different manufacturing and assembly processes. For instance, many integrated circuit (IC) chips are electrically and mechanically coupled to a PCB through a thermal compression bonding process in which solder bumps on the IC chip (and/or on the PCB) are pressed against corresponding contacts on the PCB (and/or the IC chip). This compression occurs at elevated temperatures that cause the solder to melt and reflow to produce reliable solder joints between contacts on the IC chip and the PCB. Due to a mismatch of the coefficient of thermal expansion (CTE) of different materials in the PCB and/or the IC chip, the elevated temperatures associated with the reflow process can result in warpage of the PCB due to different amounts of expansion or shrinkage of the materials involved. Such warpage gives rise to construction issues such as poor and/or incomplete solder joints, solder bridging, components being lifted or moved relative to other components on the PCB, and/or damage to the components. The relatively low stiffness of thin PCBs can also lead to a greater likelihood of crack formation in solder joints when compared with joints on thicker (and stiffer) PCBs.

Some approaches to mitigating the above concerns include balancing the pattern of metal used for traces throughout the PCB to equalize the expansion and shrinkage across different regions of the PCB. However, in many instances this is not a viable option because of space constraints to achieve high density component placement and signal breakout. Furthermore, balancing the metal often requires additional layers in the PCB, thereby adding to the weight and thickness of the PCB. Another approach is to clamp down the PCB and/or use a fixture or pallet to hold the PCB flat during manufacturing processes to prevent the PCB from warping. While such processes can reduce warpage, they involve additional equipment and procedures that add to the cost of manufacturing such PCBs. A related alternative is to extend screws through holes in the keep out zone (KOZ) of the PCB to apply an external force from an associated support frame that reduces warpage and/or deflection in the PCB. Most PCTs include a KOZ, which is a region along an outer perimeter of a PCB in which no electrical circuits are located. However, the KOZ would need to be enlarged relative to many existing PCBs to provide sufficient space for the holes through which the screws are to extend in the above approach. As a result, there would be less space on the PCB for electrical wiring and/or the size or footprint of the PCB would need to be increased.

Figure 2:
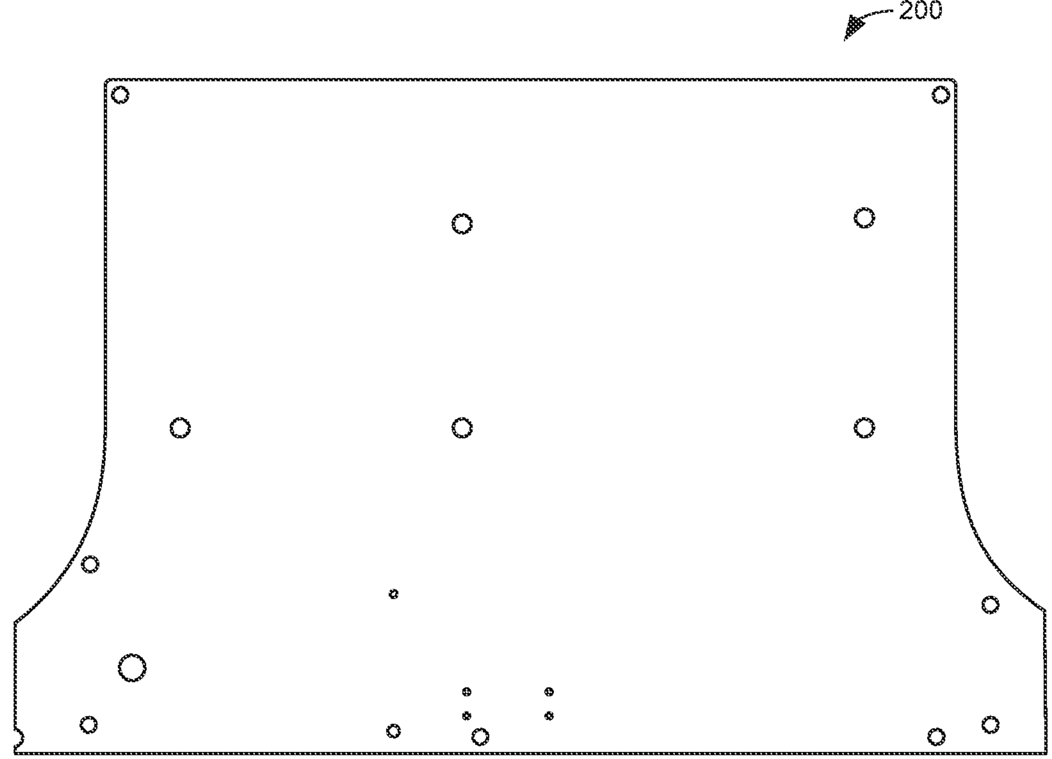
FIG. 2 illustrates an example PCB with non-linear edges.

Another known approach to reduce warpage in and/or increase the rigidity and/or stiffness of a PCB is to include metal brackets or braces along the edges of the PCB as shown in FIG. 1. In particular, FIG. 1 is a cross-sectional view of a portion of a known PCB assembly 100 that includes a PCB 102 supporting multiple different electronic components 104, 106, 108. Further, as shown in FIG. 1, a metal brace 110 is attached to an external edge 112. More specifically, the metal brace 110 wraps around the edge 112 of the PCB 102 to interface with both a top surface 114 and a bottom surface 116 of the PCB 102 adjacent the edge 112 of the PCB 102. While the brace 110 may provide some strength to the PCB 102, there are several disadvantages with the approach represented in FIG. 1. For instance, the brace 110 extends beyond the edge 112 of the PCB 102 in a direction generally normal to the lateral surface of the edge 112 (e.g., a direction extending generally parallel to the top and bottom surfaces 114, 116). As a result, the brace 110 effectively increases the footprint or area of the PCB 102 thereby preventing a separate PCB and/or some other component from being positioned as close to the edge 112 of the PCB 102 as would otherwise be possible if the brace 110 was omitted. As a result, the overall footprint of a device containing the PCB 102 may need to be increased. In addition to extending beyond the lateral edge 112, the brace 110 also extends beyond and away from the top and bottom surfaces 114, 116 of the PCB 102 in a direction generally normal to the surfaces 114, 116. Stated differently, as shown in FIG. 1, the thickness of the brace 110 is greater than the thickness of the PCB 102. The relatively thick brace 110 may undermine some of the intended benefits of implementing a thin PCB 102. Furthermore, in some instances, the thickness and location of the brace 110 may obstruct or at least render it difficult to obtain access to side connectors or external ports such as the side connector 118 of the first component 104 shown in FIG. 1. Another limitation of the brace 110 is that such braces are typically employed along linear edges of PCBs because of the difficulty in manufacturing and/or attaching braces along non-linear PCB edges such as the edges of the example PCB 200 shown in FIG. 2.

Figure 3:
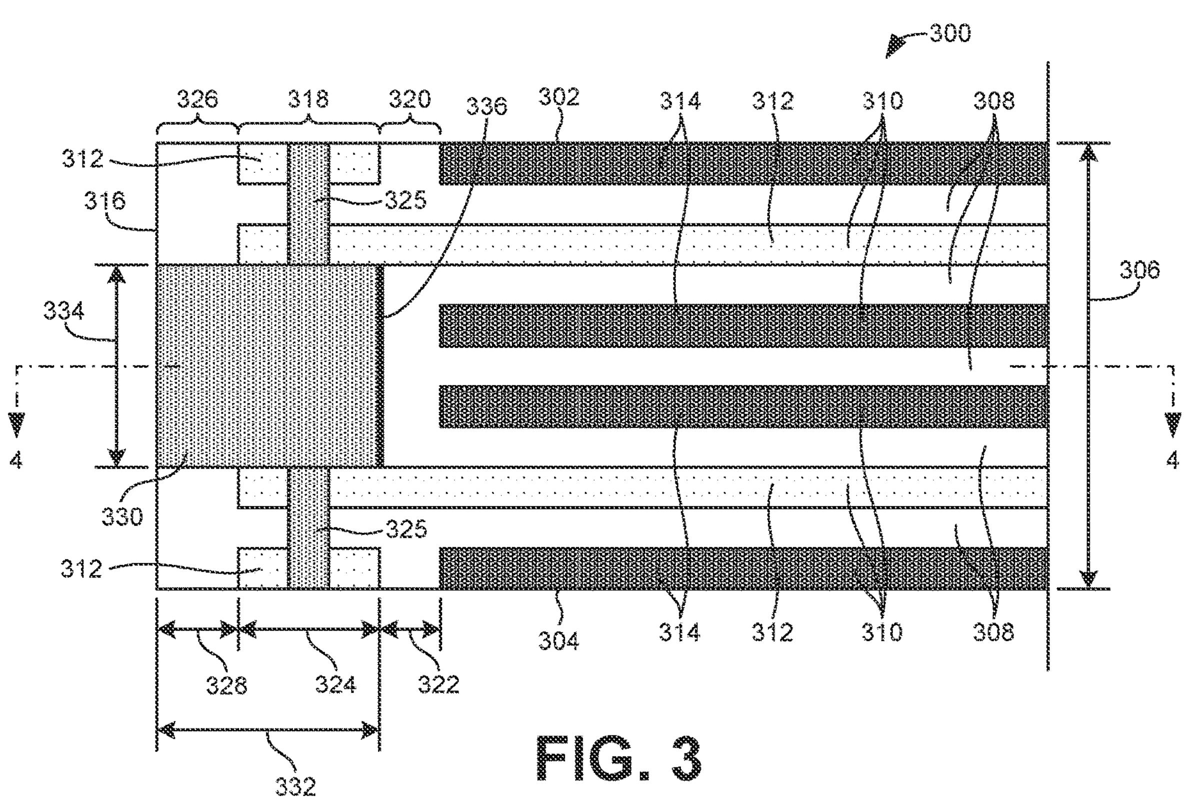
FIG. 3 is a cross-sectional side view of a portion of an example PCB constructed in accordance with teachings disclosed herein.
Figure 4:
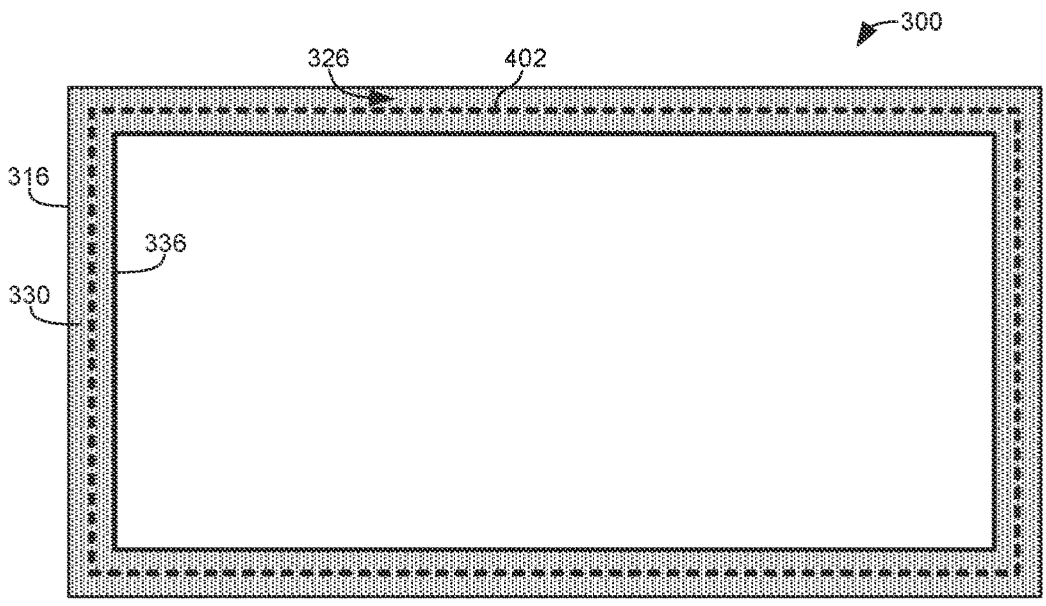
FIG. 4 is a cross-sectional top view of the example PCB of FIG. 3 taken along line 4-4 of FIG. 3.

FIG. 3 is a cross-sectional side view of a portion of an example PCB 300 constructed in accordance with teachings disclosed herein to overcome the disadvantages and limitations of the brace 110 discussed above in connection with FIG. 1. FIG. 4 is a cross-sectional top view of the example PCB 300 of FIG. 3 taken along the line 4-4 of FIG. 3. Although examples disclosed herein are described in the context of PCBs, teachings disclosed herein may additionally or alternatively be implemented on package substrates for integrated circuit (IC) packages. In the illustrated example, the PCB 300 includes a first (e.g., top) surface 302 and a second (e.g., bottom) surface 304 that face away from each other and define a thickness 306 of the PCB 300. In this example, the main body of the PCB 300 includes a stack of alternating layers of insulative material 308 (also referred to herein as insulative layers) and conductive material 310 (also referred to herein as conductive layers) that have been laminated together. For purposes of explanation, the insulative layers 308 are shown in white while the conductive layers 310 are shaded. Further, different shading is used in the conductive layers 310 to distinguish between grounded metal 312 (indicated by the light shading) and input/output (IO) routing metal 314 (indicated by the dark shading).

While the different shading represents the different purposes of the conductive material 310, the same material may be used for all of the conductive material 310. In some examples, the conductive material 310 correspond to copper foil. However, any other type of conductive material may additionally or alternatively be used. Although the IO routing metal 314 is shown as extending continuously across the PCB 300 this is for purposes of simplicity. In some examples, the IO routing metal can be patterned with traces or wires to provide any suitable electrical paths for signals to pass through the PCB 300. In some examples, the number of layers of conductive material 310 (and corresponding number of layers of the insulative material 308) can be more or fewer than what is shown in FIG. 3. Further, the arrangement of the metal layers and/or the number of layers of IO routing relative to the number of layers of grounded metal can differ from what is shown in the illustrated example. In some examples, the insulative material 308 corresponds to cured epoxy but any other insulative material may additional or alternatively be used.

As shown in FIG. 3, the grounded metal 312 of the conductive material 310 extends beyond the IO routing metal 314 towards an external edge or perimeter 316 of the PCB 300. More particularly, in this example, the grounded metal 312 extends into a ground ring area 318. The ground ring area 318 includes grounded metal in each of the layers of the conductive material 310. Thus, in some examples, a single layer of conductive material 310 (such as the uppermost and bottommost layers shown in FIG. 3) can include both metal for IO routing (e.g., in the main body of the PCB 300) and metal that is grounded (e.g., in the ground ring area 318). In such examples, the grounded metal 312 in the ground ring area 318 is electrically isolated from the IO routing metal 314 by a gap 320. In some examples, a width 322 of the gap is approximately 0.05 millimeters (mm). However, a larger or smaller width 322 is also possible. In some examples, a width 324 of the ground ring area 318 is approximately 0.50 mm. However, a larger or smaller width 324 is also possible. In some examples, the grounded metal 312 in the different metal layers are electrically coupled by metal vias 325 extending between the metal layers.

In the illustrated examples, none of the conductive material 310 (neither the grounded metal 312 nor the IO routing metal 314) extends into a keep out area or keep out zone (KOZ) 326. Thus, the KOZ 326 is composed of the insulative material 308. The KOZ 326 defines the outer perimeter (e.g., the edge 316) of the PCB 300. PCBs are typically designed to have a KOZ that does not include any electrical circuits to enable the mechanical handling of the PCBs without significant risk to damaging electrical circuits or wiring included therein. In some examples, a width 328 of the KOZ 326 is approximately 0.25 mm. However, a larger or smaller width 328 is also possible. For purposes of illustration, the inner boundary of the KOZ 326 is represented by the dashed line 402 in FIG. 4.

Unlike typical PCBs in which no conductive material is included in the KOZ, in the illustrated example of FIGS. 3 and 4, the example PCB 300 includes a metal stiffener 330 that extends along the perimeter or edge 316 of the PCB 300 within the KOZ 326. In some examples, the stiffener 330 is made of the same material used in the layers of conductive material 310. Specifically, in some examples, the stiffener 330 is a strip or block of copper. However, any other suitable material may alternatively be used. In some examples, the stiffener 330 extends through the full width 328 of the KOZ 326. In some examples, as shown, the stiffener 330 extends through the KOZ 326 and into the ground ring area 318. In some examples, the stiffener 330 has a width 332 that is approximately equivalent to the combined widths 328, 324 of the KOZ 326 and the ground ring area 318. In some examples, the width 332 of the stiffener 330 is greater than the combined widths 328, 324 of the KOZ 326 and the ground ring area 318. In other examples, the width 332 of the stiffener 330 is less than the combined widths 328, 324 of the KOZ 326 and the ground ring area 318. In some examples, the ground ring area 318 is omitted. In some such examples, the width 328 of the KOZ 326 may be larger than described above (e.g., to include the width of the ground ring area 318).

As shown in FIG. 4, the stiffener 330 extends completely around the perimeter of the PCB 300. As a result, in some examples, the stiffener 330 provides electrical shielding (e.g., electromagnetic interference (EMI) shielding) to the circuits within the PCB 300. In other examples, the stiffener 330 extends less than all the way around the perimeter. In some examples, the stiffener 330 is substantially flush with and exposed along the edge 316 of the PCB 300. Thus, unlike the brace 110 of FIG. 1, the stiffener 330 does not extend beyond the edge of the PCB 300. As a result, the stiffener 330 is able to provide additional strength and/or rigidity to the PCB 300 without affecting the footprint or size of the outer perimeter of the PCB 300. That is, in some examples, the stiffener 330 extends along an outer edge of the PCB 300 without extending beyond the outer edge in a direction away from the printed circuit board. Also, unlike the brace 110 that wraps around and is on the outside of the top and bottom surfaces 114, 116 of the PCB 102 of FIG. 1, the stiffener 330 is embedded or positioned between the outer surfaces 302, 304 of the PCB 300. More particularly, in some examples, the stiffener 330 is sandwiched between two separate layers of insulative material 308 in the PCB 300. Thus, in this example, the stiffener 330 has a thickness 334 that is less than the thickness 306 of the PCB 300.

In some examples, the thickness 334 of the stiffener 330 corresponds to the combined thickness of at least two of the layers of the insulative material 308. In some examples, the thickness 334 of the stiffener 330 depends upon the overall thickness 306 of the PCB 300. For instance, in some examples, for a thickness 306 of 0.6 mm for the PCB 300, the thickness 334 of the stiffener 330 is between approximately 0.3 mm and 0.5 mm. Thus, in some examples, the thickness 334 of the stiffener 330 is less than the width 332 of the stiffener 330. In some examples, the thickness 334 of the stiffener 330 is less than 0.3 mm. In some examples, where the thickness of the PCB 300 is greater than 0.6 mm, the thickness 334 of the stiffener 330 is greater than 0.5 mm.

Although the stiffener 330 is shown positioned at a center plane between the first and second outer surfaces 302, 304 of the PCB 300, in other examples, the stiffener 330 is closer to one of the surfaces 302, 304 than it is to the other surface. Further, although only one stiffener 330 is shown, in some examples, more than one stiffener 330 can be implemented along the edge 316 distributed in a direction extending between the first and second surfaces 302, 304. In some examples, as described further below, an adhesive 336 is used to facilitate the attachment of the stiffener 330 to adjacent ones of the layers of insulative material 308. In some examples, the adhesive 336 is a conductive adhesive to enable the electrical coupling of the stiffener to conductive material 310 (e.g., grounded metal 312) between ones of the adjacent layers of the insulative material 308.

Simulated tests for bending and twisting of a PCB with the stiffener 330 as disclosed herein indicate significant improvements in stiffness and/or rigidity relative to a PCB that does not include such a stiffener. For instance, a 0.6 mm thick PCB having length and width dimensions of 220 mm by 40 mm was found withstand a three-point bending force or stress of approximately 0.155 newtons (N) and a twisting force or stress of approximately 0.356N. By contrast, a similarly dimensioned PCB with a stiffener 330 having a thickness 334 of 0.3 mm and a width 332 of 0.75 mm was found to withstand a bending force of approximately 0.185N and a twisting force of approximately 0.521N. Further, increasing the thickness 334 of the stiffener 330 was found to provide even greater stiffness. In particular, a stiffener 330 with a thickness 334 of 0.4 mm enables the PCB to withstand bending forces of approximately 0.212N and twisting forces of approximately 0.670N and a stiffener 330 with a thickness 334 of 0.5 mm enables the PCB to withstand bending forces of approximately 0.249N and twisting forces of approximately 0.914N. The forces associated with the 0.5 mm thick stiffener approach and, in some cases, exceed the forces that a 0.8 mm thick PCB without a stiffener can withstand. In particular, the 0.8 mm thick PCB can withstand bending forces of approximately 0.357N and twisting forces of approximately 0.766N. Thus, a thinner (0.6 mm) PCB can withstand approximately 70% of the bending forces withstood by a thicker (0.8 mm) PCB and approximately 20% more twisting forces than the thicker (0.8 mm) PCB by the inclusion of the 0.5 mm thick stiffener 330.

Figures 5, 6, 7, 8:
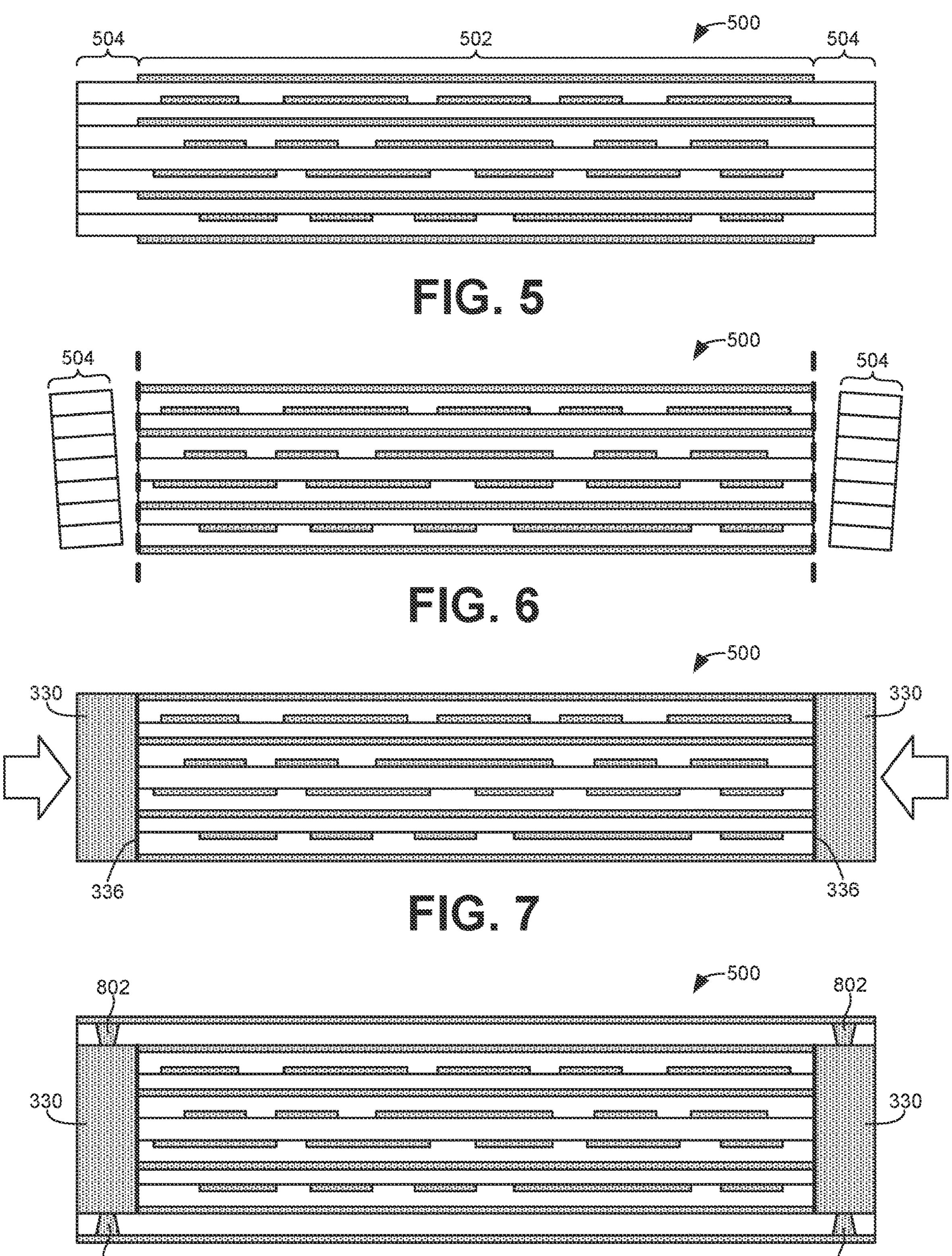
FIGS. 5-8 are cross-sectional views of different stages during the fabrication of an example PCB constructed in accordance with teachings disclosed herein.

FIGS. 5-8 are cross-sectional views of different stages during the fabrication of an example PCB 500 constructed in accordance with teachings disclosed herein. FIG. 5 represents the stage of fabrication of the PCB 500 with an initial stack of insulative and conductive layers (e.g., initial buildup layers). This initial stack of buildup layers is constructed up to a thickness corresponding to the thickness 334 of the stiffener 330. Thus the number of layers depends on the thicknesses of the individual layers and the associated thickness 334 of the stiffener 330 to be attached. The construction of the PCB 500 up to the point represented in FIG. 5 can follow standard fabrication processes presently known and/or any other suitable fabrication processes. Thus, as with many typical PCBs, the PCB 500 in this example includes a main body 502 and a KOZ 504. The main body includes conductive material including I0 routing metal and grounded metal. In some examples, metal vias may interconnect different layers of the conductive material. However, such vias are not shown in the illustrated example for the sake of simplicity. The KOZ 504 does not include any metal for electrical circuits.

The stage of fabrication represented by FIG. 6 illustrates the removal of the KOZ 504 included in the PCB 500 shown in FIG. 5. In some examples, the KOZ 504 is removed by cutting through the PCB 500 (as represented by the dashed lines in FIG. 6). The cutting process may be implemented using a laser or a mechanical saw.

The stage of fabrication represented by FIG. 7 illustrates the attachment of the stiffener 330 to the outer edge of the PCB 500. More particularly, the stiffener 330 is attached at the location where the removed KOZ 504 was previously located. In some examples, the thickness of the stiffener 330 is approximately the same as the thickness of the removed KOZ 504 to maintain a consistent size or footprint for the PCB 500. In some examples, the stiffener 330 is attached to the PCB 500 using an adhesive 336 and compression (represented by the arrows in FIG. 7). In some examples, the adhesive is a high temperature conductive adhesive. The conductive nature of the adhesive electrical couples the stiffener 330 to the layers of conductive material (e.g., the grounded metal) that extends to the point at which the KOZ 504 was cut from the PCB 500. In some examples, less than all the KOZ 504 is removed and/or the conductive material does not extend to the point at which the PCB 500 is cut to remove the KOZ 504. In such examples, there is no exposed metal to which the stiffener 330 may electrically connect. Accordingly, in some such examples, the adhesive is non-conductive. In some examples, a non-conductive adhesive is used even when conductive material in the stack of initial buildup layers is exposed along the surfaces where the PCB 500 was cut. Different examples methods to attach the stiffener 330 to the PCB 500 are described further below in connection with FIGS. 9-11.

The stage of fabrication represented by FIG. 8 illustrates the lamination of additional buildup layers onto either side of the PCB 500. In this example, the additional buildup layers are the same size as the buildup layers used to fabricate the PCB 500 at the stage of fabrication represented in FIG. 5. Thus, the additional buildup layers extend across and cover the stiffener 330 such that the stiffener 330 is sandwiched or embedded between the additional buildup layers. In the illustrated example of FIG. 8, only one additional build layer is added to either side of the PCB 500. However, in other examples, more than one additional layer can be added. In some examples, a different number of additional layers are added to each side of the PCB 500. In some examples, metal vias 802 are fabricated to extend through the additional buildup layers to electrically connect the stiffener 330 to metal in the additional buildup layers. In some examples, the metal vias 802 are omitted so that the stiffener 330 is electrically isolated from the metal in the additional buildup layers. Following the stage of fabrication represented in FIG. 8, subsequent operations may be employed to complete the PCB 500 using any suitable processes now known or developed in the future.

Figure 9:
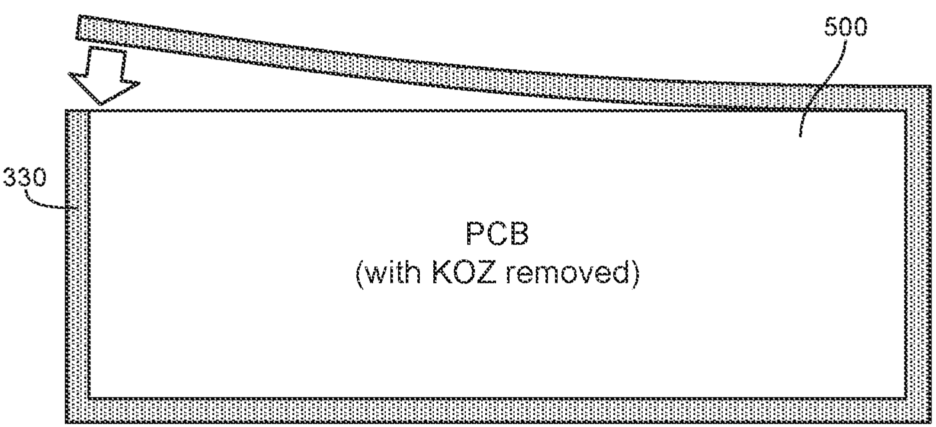
FIGS. 9-11 illustrate different example methods of attachment of the stiffener to the PCB at the stage of fabrication represented in FIG. 7.
Figure 10:
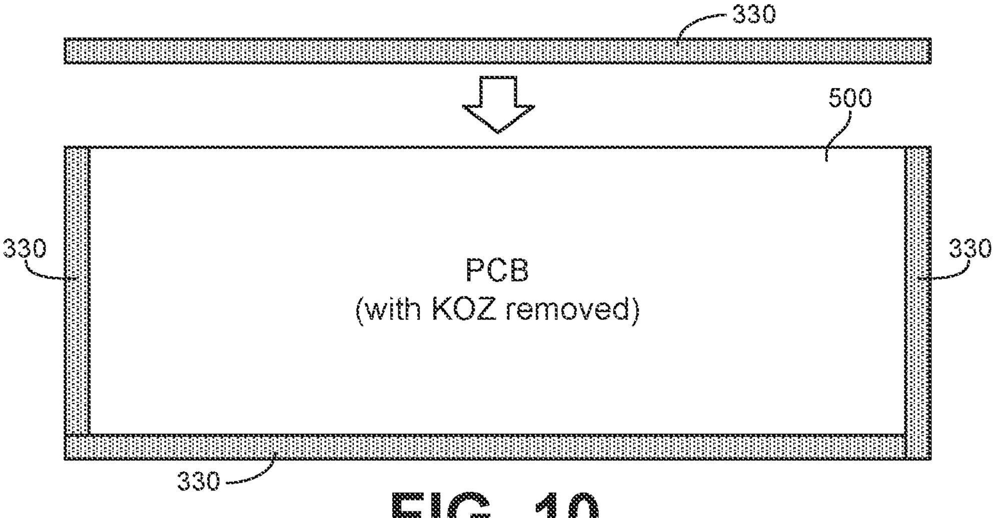
Figure 11:
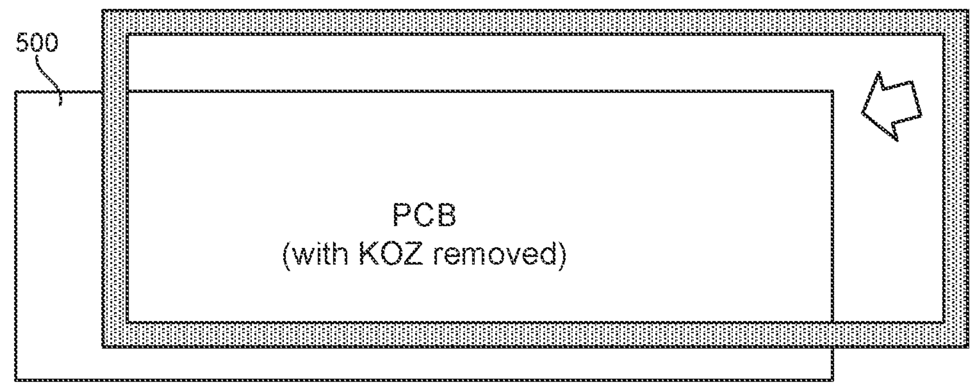

FIGS. 9-11 illustrate different example methods of attachment of the stiffener 330 to the PCB 500 at the stage of fabrication represented in FIG. 7. Thus, as labelled in FIGS. 9-11 the PCB 500 already has the KOZ 504 removed. In the illustrated example of FIG. 9, the stiffener 330 is an elongated strip of metal (e.g., copper wire) that is wrapped around and extends continuously along the perimeter of the PCB 500. Attaching the stiffener 330 in this manner enables the stiffener 330 to follow any suitable shape of the PCB 500 including non-linear edges (such as the non-linear edges of the PCB 200 of FIG. 2). In the illustrated example of FIG. 10, the stiffener 330 corresponds to discrete lengths or blocks of metal that are attached to separate portions (e.g., individual edges) of the perimeter of the PCB 500. In the illustrated example of FIG. 11, the stiffener 330 defines a closed loop or ring with a shape corresponding to the perimeter of the PCB 500 to fit around and be attached to the edges of the PCB 500.

Figure 12:
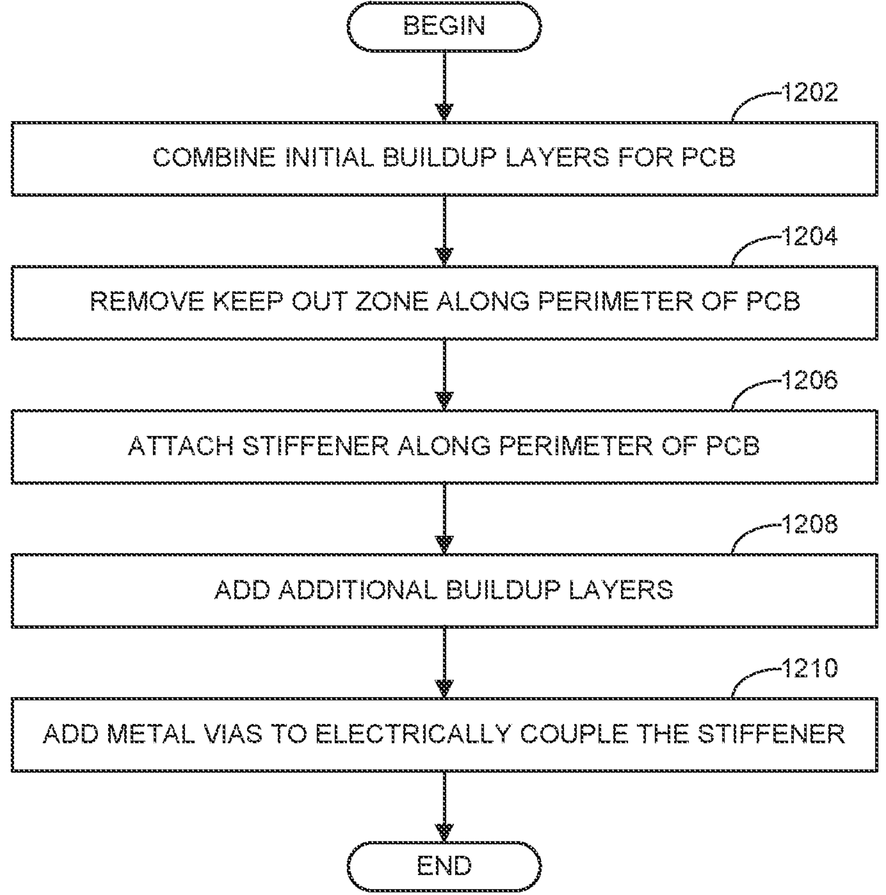
FIG. 12 is a flowchart representative of an example method of manufacturing the example PCBs of FIGS. 3-11.

FIG. 12 is a flowchart representative of an example method of manufacturing the example PCBs 300, 500 of FIGS. 3-11. The example process begins at block 1202 by combining initial buildup layers for the PCB 500. The implementation of block 1202 is represented by FIG. 5 discussed above. Block 1204 involves removing the keep out zone (KOZ) 504 along the perimeter of the PCB 500. The implementation of block 1204 is represented by FIG. 6 discussed above. Block 1206 involves attaching a stiffener 330 along the perimeter of the PCB 500. The implementation of block 1206 is represented by FIG. 7 and may be performed using any one of the techniques described above in connection with FIGS. 9-11. Block 1208 involves adding additional buildup layers. Block 1210 involves adding metal vias to electrically couple the stiffener 330. The implementation of blocks 1208 and 1210 are represented by FIG. 8 discussed above. Thereafter, the example process of FIG. 12 ends. Although the example method of manufacture is described with reference to the flowchart illustrated in FIG.

12, many other methods of manufacturing the example PCBs 300, 500 may alternatively be used. For example, the order of execution of the blocks may be changed, and/or some of the blocks described may be changed, divided, eliminated, or combined.

Figure 13:
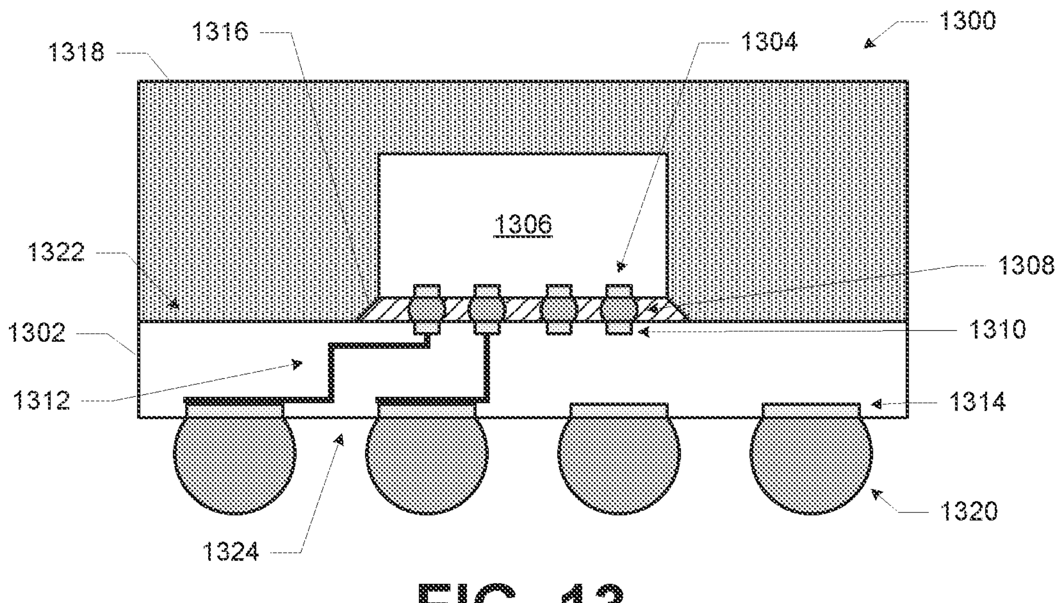
FIG. 13 is a cross-sectional side view of an IC package that may include and/or be mounted an example PCB, in accordance with various examples.
Figure 14:
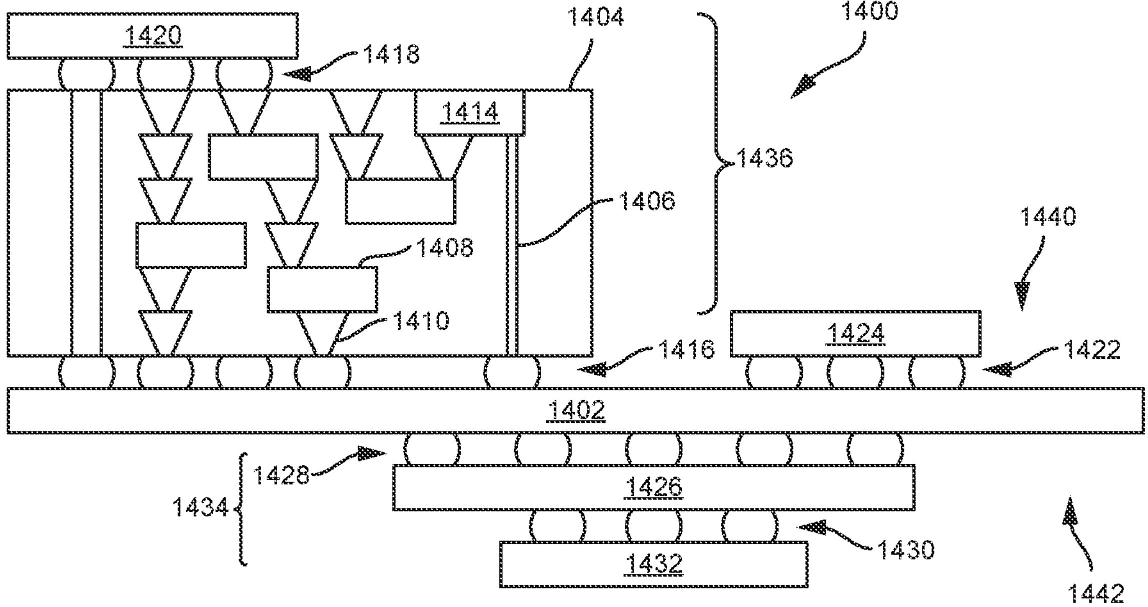
FIG. 14 is a cross-sectional side view of an IC device assembly that may include an IC package constructed in accordance with teachings disclosed herein.
Figure 15:
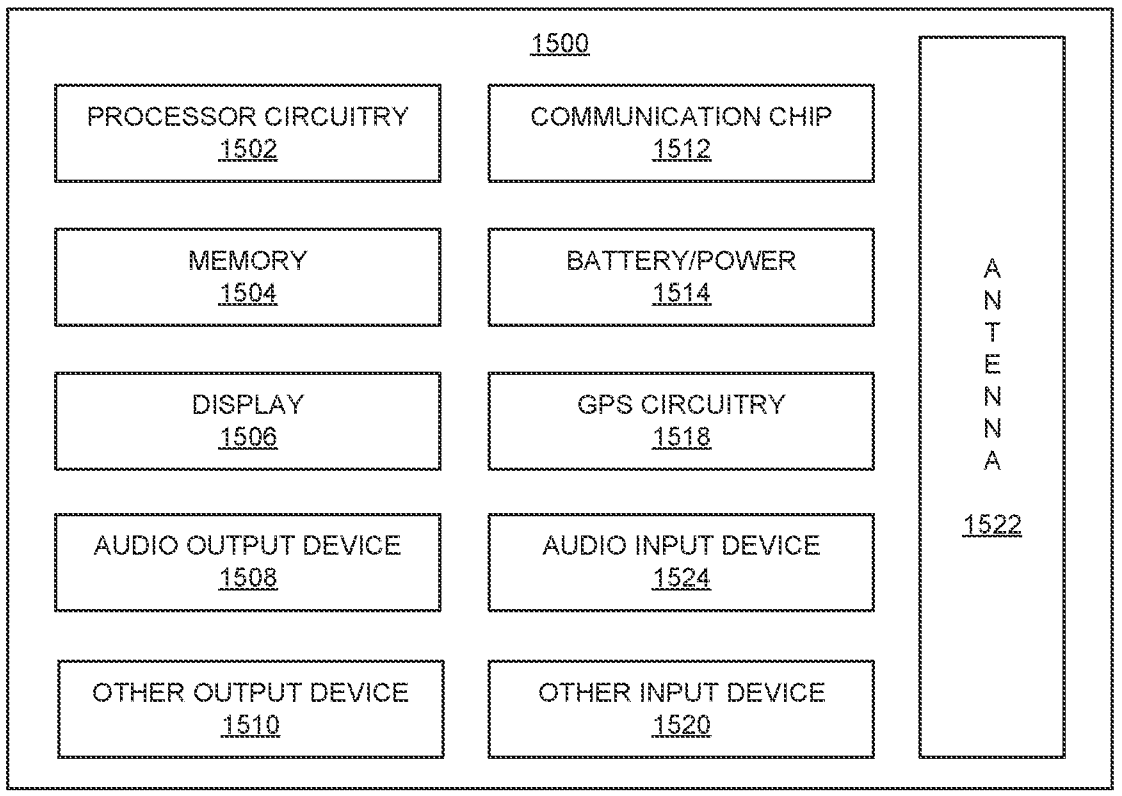
FIG. 15 is a block diagram of an example electrical device that may include an IC package constructed in accordance with teachings disclosed herein.

The example PCB 300, 500 disclosed herein may be included in any suitable electronic component. FIGS. 13-15 illustrate various examples of apparatus that may include and/or be coupled to the example PCBs 300, 500 disclosed herein.

FIG. 13 is a cross-sectional view of an example IC package 1300 that includes an example package substrate 1302 that may be constructed in accordance with the example PCBs 300, 500 disclosed above. The package substrate 1302 may be formed of a dielectric material, and may have conductive pathways extending through the dielectric material between upper and lower faces 1322, 1324, or between different locations on the upper face 1322, and/or between different locations on the lower face 1324.

The IC package 1300 may include a die 1306 coupled to the package substrate 1302 via conductive contacts 1304 of the die 1306, first-level interconnects 1308, and conductive contacts 1310 of the package substrate 1302. The conductive contacts 1310 may be coupled to conductive pathways 1312 through the package substrate 1302, allowing circuitry within the die 1306 to electrically couple to various ones of the conductive contacts 1314 or to other devices included in the package substrate 1302, not shown. The first-level interconnects 1308 illustrated in FIG. 13 are solder bumps, but any suitable first-level interconnects 1308 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 1316 may be disposed between the die 1306 and the package substrate 1302 around the first-level interconnects 1308, and a mold compound 1318 may be disposed around the die 1306 and in contact with the package substrate 1302. In some examples, the underfill material 1316 may be the same as the mold compound 1318. Example materials that may be used for the underfill material 1316 and the mold compound 1318 are epoxy mold materials, as suitable. Second-level interconnects 1320 may be coupled to the conductive contacts 1314. The second-level interconnects 1320 illustrated in FIG. 13 are solder balls (e.g., for a ball grid array arrangement), but any suitable second-level interconnects 1320 may be used (e.g., pins in a pin grid array arrangement or lands in a land grid array arrangement). The second-level interconnects 1320 may be used to couple the IC package 1300 to another component, such as a circuit board (e.g., a motherboard), an interposer, or another IC package, as known in the art and as discussed below with reference to FIG. 14.

In FIG. 13, the IC package 1300 is a flip chip package. Although the IC package 1300 illustrated in FIG. 13 is a flip chip package, other package architectures may be used. For example, the IC package 1300 may be a ball grid array (BGA) package, such as an embedded wafer-level ball grid array (eWLB) package. In another example, the IC package 1300 may be a wafer-level chip scale package (WLCSP) or a panel fanout (FO) package. Although a single die 1306 is illustrated in the IC package 1300 of FIG. 13, an IC package 1300 may include multiple dies 1306. An IC package 1300 may include additional passive components, such as surface-mount resistors, capacitors, and inductors disposed on the first face 1322 or the second face 1324 of the package substrate 1302. More generally, an IC package 1300 may include any other active or passive components known in the art.

FIG. 14 is a cross-sectional side view of an IC device assembly 1400 that may include any one of the example PCBs 300, 500 disclosed herein. The IC device assembly 1400 includes a number of components disposed on a circuit board 1402 (which may be, for example, a motherboard). The IC device assembly 1400 includes components disposed on a first face 1440 of the circuit board 1402 and an opposing second face 1442 of the circuit board 1402; generally, components may be disposed on one or both faces 1440 and 1442.

In some examples, the circuit board 1402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1402. In other examples, the circuit board 1402 may be a non-PCB substrate. In some examples, the circuit board 1402 is constructed in accordance with the PCBs 300, 500 disclosed above.

The IC device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), male and female portions of a socket, an adhesive, an underfill material, and/or any other suitable electrical and/or mechanical coupling structure.

The package-on-interposer structure 1436 may include an IC package 1420 coupled to an interposer 1404 by coupling components 1418. The coupling components 1418 may take any suitable form for the application, such as the forms discussed above with reference to the coupling components 1416. Although a single IC package 1420 is shown in FIG. 14, multiple IC packages may be coupled to the interposer 1404; indeed, additional interposers may be coupled to the interposer 1404. The interposer 1404 may provide an intervening substrate used to bridge the circuit board 1402 and the IC package 1420. The IC package 1420 may be or include, for example, a die (the die 1306 of FIG. 13), an IC device, or any other suitable component. Generally, the interposer 1404 may spread a connection to a wider pitch or reroute a connection to a different connection. For example, the interposer 1404 may couple the IC package 1420 (e.g., a die) to a set of BGA conductive contacts of the coupling components 1416 for coupling to the circuit board 1402. In the example illustrated in FIG. 14, the IC package 1420 and the circuit board 1402 are attached to opposing sides of the interposer 1404; in other examples, the IC package 1420 and the circuit board 1402 may be attached to a same side of the interposer 1404. In some examples, three or more components may be interconnected by way of the interposer 1404.

In some examples, the interposer 1404 may be formed as a PCB, including multiple metal layers separated from one another by layers of dielectric material and interconnected by electrically conductive vias. In some examples, the interposer 1404 may be formed of an epoxy resin, a fiberglass-reinforced epoxy resin, an epoxy resin with inorganic fillers, a ceramic material, or a polymer material such as polyimide. In some examples, the interposer 1404 may be formed of alternate rigid or flexible materials that may include the same materials described above for use in a semiconductor substrate, such as silicon, germanium, and other group III-V and group IV materials. The interposer 1404 may include metal interconnects 1408 and vias 1410, including but not limited to through-silicon vias (TSVs) 1406. The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art.

The IC device assembly 1400 may include an IC package 1424 coupled to the first face 1440 of the circuit board 1402 by coupling components 1422. The coupling components 1422 may take the form of any of the examples discussed above with reference to the coupling components 1416, and the IC package 1424 may take the form of any of the examples discussed above with reference to the IC package 1420.

The IC device assembly 1400 illustrated in FIG. 14 includes a package-on-package structure 1434 coupled to the second face 1442 of the circuit board 1402 by coupling components 1428. The package-on-package structure 1434 may include a first IC package 1426 and a second IC package 1432 coupled together by coupling components 1430 such that the first IC package 1426 is disposed between the circuit board 1402 and the second IC package 1432. The coupling components 1428, 1430 may take the form of any of the examples of the coupling components 1416 discussed above, and the IC packages 1426, 1432 may take the form of any of the examples of the IC package 1420 discussed above. The package-on-package structure 1434 may be configured in accordance with any of the package-on-package structures known in the art.

FIG. 15 is a block diagram of an example electrical device 1500 that may include one or more of the example PCBs constructed in accordance with teachings disclosed herein. A number of components are illustrated in FIG. 15 as included in the electrical device 1500, but any one or more of these components may be omitted or duplicated, as suitable for the application. In some examples, some or all of the components included in the electrical device 1500 may be attached to one or more motherboards. In some examples, some or all of these components are fabricated onto a single system-on-a-chip (SoC) die.

Additionally, in various examples, the electrical device 1500 may not include one or more of the components illustrated in FIG. 15, but the electrical device 1500 may include interface circuitry for coupling to the one or more components. For example, the electrical device 1500 may not include a display 1506, but may include display interface circuitry (e.g., a connector and driver circuitry) to which a display 1506 may be coupled. In another set of examples, the electrical device 1500 may not include an audio input device 1524 (e.g., microphone) or an audio output device 1508 (e.g., a speaker, a headset, earbuds, etc.), but may include audio input or output device interface circuitry (e.g., connectors and supporting circuitry) to which an audio input device 1524 or audio output device 1508 may be coupled.

The electrical device 1500 may include a processor circuitry 1502 (e.g., one or more processing devices). As used herein, the term "processing device" or "processor" may refer to any device or portion of a device that processes electronic data from registers and/or memory to transform that electronic data into other electronic data that may be stored in registers and/or memory. The processor circuitry 1502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1500 may include a memory 1504, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1504 may include memory that shares a die with the processor circuitry 1502. This memory may be used as cache memory and may include embedded dynamic random access memory (eDRAM) or spin transfer torque magnetic random access memory (STT-MRAM).

In some examples, the electrical device 1500 may include a communication chip 1512 (e.g., one or more communication chips). For example, the communication chip 1512 may be configured for managing wireless communications for the transfer of data to and from the electrical device 1500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1512 may operate in accordance with other wireless protocols in other examples.

The electrical device 1500 may include an antenna 1522 to facilitate wireless communications and/or to receive other wireless communications (such as AM or FM radio transmissions).

In some examples, the communication chip 1512 may manage wired communications, such as electrical, optical, or any other suitable communication protocols (e.g., the Ethernet). As noted above, the communication chip 1512 may include multiple communication chips. For instance, a first communication chip 1512 may be dedicated to shorter-range wireless communications such as Wi-Fi or Bluetooth, and a second communication chip 1512 may be dedicated to longer-range wireless communications such as global positioning system (GPS), EDGE, GPRS, CDMA, WiMAX, LTE, EV-DO, or others. In some examples, a first communication chip 1512 may be dedicated to wireless communications, and a second communication chip 1512 may be dedicated to wired communications.

The electrical device 1500 may include battery/power circuitry 1514. The battery/power circuitry 1514 may include one or more energy storage devices (e.g., batteries or capacitors) and/or circuitry for coupling components of the electrical device 1500 to an energy source separate from the electrical device 1500 (e.g., AC line power).

The electrical device 1500 may include a display 1506 (or corresponding interface circuitry, as discussed above). The display 1506 may include any visual indicators, such as a heads-up display, a computer monitor, a projector, a touchscreen display, a liquid crystal display (LCD), a light-emitting diode display, or a flat panel display.

The electrical device 1500 may include an audio output device 1508 (or corresponding interface circuitry, as discussed above). The audio output device 1508 may include any device that generates an audible indicator, such as speakers, headsets, or earbuds.

The electrical device 1500 may include an audio input device 1524 (or corresponding interface circuitry, as discussed above). The audio input device 1524 may include any device that generates a signal representative of a sound, such as microphones, microphone arrays, or digital instruments (e.g., instruments having a musical instrument digital interface (MIDI) output).

The electrical device 1500 may include a GPS circuitry 1518. The GPS circuitry 1518 may be in communication with a satellite-based system and may receive a location of the electrical device 1500, as known in the art.

The electrical device 1500 may include any other output device 1510 (or corresponding interface circuitry, as discussed above). Examples of the other output device 1510 may include an audio codec, a video codec, a printer, a wired or wireless transmitter for providing information to other devices, or an additional storage device.

The electrical device 1500 may include any other input device 1520 (or corresponding interface circuitry, as discussed above). Examples of the other input device 1520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1500 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1500 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that increase the rigidity and/or stiffness of a PCB without affecting the thickness and/or overall size (footprint) of the PCB. More particularly, this is accomplished by embedding a metal stiffener within the KOZ of the PCB. While the added stiffness is particularly beneficial for thin PCBs (e.g., 0.6 mm or less), example stiffeners disclosed herein can be used in PCBs of any thickness. In some instances, the metal stiffener extends entirely around a perimeter of the PCB to provide electrical shielding for the circuits within the PCB. Further, as noted above, while examples detailed herein are described as corresponding to PCBs, teachings disclosed herein may additionally or alternatively be implemented on other types of board and/or substrates such as package substrates for IC packages.

Further examples and combinations thereof include the following:

Example 1 includes an apparatus comprising a stack of insulative layers, the stack including a first face and a second face opposite the first face, a plurality of conductive layers, ones of the conductive layers between adjacent ones of the insulative layers, and a metal stiffener extending along a perimeter of a first one of the insulative layers, the metal stiffener having a thickness measured in a direction perpendicular to the first face, the thickness being less than a distance between the first and second faces.

Example 2 includes the apparatus of example 1, wherein the metal stiffener is sandwiched between second and third ones of the insulative layers.

Example 3 includes the apparatus of example 2, further including a metal via extending through the second insulative layer, the metal via to be electrically coupled to the metal stiffener.

Example 4 includes the apparatus of any one of examples 1-3, wherein the metal stiffener includes a width measured in a direction parallel to the first face and extending away from the first insulative layer, the width being greater than the thickness of the metal stiffener.

Example 5 includes the apparatus of example 4, wherein the thickness is less than or equal to example 0 includes 5 mm.

Example 6 includes the apparatus of any one of examples 1-5, wherein the metal stiffener includes copper.

Example 7 includes the apparatus of any one of examples 1-6, wherein the metal stiffener is electrically coupled to a first conductive layer in contact with the first insulative layer.

Example 8 includes the apparatus of any one of examples 1-6, wherein the metal stiffener is electrically isolated from ones of the conductive layers.

Example 9 includes the apparatus of any one of examples 1-8, wherein the metal stiffener extends continuously around an entirety of a perimeter of the first insulative layer.

Example 10 includes the apparatus of any one of examples 1-9, wherein the metal stiffener extends along a perimeter of a subset of the insulative layers, the subset including the first insulative layer and other ones of the insulative layers but less than all of the insulative layers.

Example 11 includes an apparatus comprising a printed circuit board including a first face and a second face opposite the first face, the printed circuit board including an outer edge extending between the first and second faces, and a metal stiffener extending along the outer edge of the printed circuit board without extending beyond the outer edge in a direction away from the printed circuit board.

Example 12 includes the apparatus of example 11, wherein the metal stiffener extends into a keep out area of printed circuit board.

Example 13 includes the apparatus of example 12, wherein the metal stiffener extends through a full width of the keep out area.

Example 14 includes the apparatus of any one of examples 11-13, wherein the metal stiffener is exposed along the outer edge of the printed circuit board.

Example 15 includes the apparatus of any one of examples 11-14, further including an adhesive between the metal stiffener and the outer edge of the printed circuit board.

Example 16 includes the apparatus of example 15, wherein the adhesive is conductive.

Example 17 includes the apparatus of any one of examples 11-16, wherein the stiffener is spaced apart from IO routing metal within the printed circuit board.

Example 18 includes the apparatus of any one of examples 11-17, wherein the stiffener is electrically coupled to a ground ring that surrounds electrical circuits within the printed circuit board.

Example 19 includes a method comprising combining initial buildup layers for a printed circuit board, the initial buildup layers having a first thickness, and attaching a stiffener along a perimeter of the printed circuit board, the stiffener having a second thickness, the second thickness corresponding to the first thickness.

Example 20 includes the method of example 19, further including adding additional buildup layers over the initial buildup layers and over the stiffener, the stiffener positioned between ones of the additional buildup layers.

Example 21 includes the method of any one of examples 19 or 20, further including removing a keep out zone along the perimeter of the printed circuit board before attaching the stiffener, the stiffener to be attached to a location where the keep out zone was removed.

Example 22 includes the method of any one of examples 19-21, further including adding metal vias to electrically couple the stiffener.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:

a stack of insulative layers, the stack including a first face and a second face opposite the first face;

a plurality of conductive layers, ones of the conductive layers between adjacent ones of the insulative layers; and a metal stiffener extending along a perimeter of a first one of the insulative layers, the metal stiffener having a thickness in a direction perpendicular to the first face, the thickness being less than a distance between the first and second faces, the metal stiffener sandwiched between second and third ones of the insulative layers.

2. The apparatus of claim 1, including a metal via extending through the second insulative layer, the metal via to be electrically coupled to the metal stiffener.

3. An apparatus comprising:

a stack of insulative layers, the stack including a first face and a second face opposite the first face;

a plurality of conductive layers, ones of the conductive layers between adjacent ones of the insulative layers; and a metal stiffener extending along a perimeter of a first one of the insulative layers, the metal stiffener having a thickness in a direction perpendicular to the first face, the thickness being less than a distance between the first and second faces, the metal stiffener having a width in a direction parallel to the first face and extending away from the first insulative layer, the width being greater than the thickness of the metal stiffener.

4. The apparatus of claim 3, wherein the thickness is less than or equal to 0.5 mm.

5. The apparatus of claim 1, wherein the metal stiffener includes copper.

6. An apparatus comprising:

a stack of insulative layers, the stack including a first face and a second face opposite the first face;

a plurality of conductive layers, ones of the conductive layers between adjacent ones of the insulative layers; and a metal stiffener extending along a perimeter of a first one of the insulative layers, the metal stiffener having a thickness in a direction perpendicular to the first face, the thickness being less than a distance between the first and second faces, the metal stiffener electrically coupled to a first conductive layer in contact with the first insulative layer.

7. The apparatus of claim 1, wherein the metal stiffener is electrically isolated from ones of the conductive layers.

8. The apparatus of claim 1, wherein the metal stiffener extends continuously around an entirety of a perimeter of the first insulative layer.

9. An apparatus comprising:

a stack of insulative layers, the stack including a first face and a second face opposite the first face;

a plurality of conductive layers, ones of the conductive layers between adjacent ones of the insulative layers; and a metal stiffener extending along a perimeter of a subset of the insulative layers, the subset including at least two of the insulative layers but less than all of the insulative layers, the metal stiffener having a thickness in a direction perpendicular to the first face, the thickness being less than a distance between the first and second faces.

10. An apparatus comprising:

a printed circuit board including a first face and a second face opposite the first face, the printed circuit board including an outer edge extending between the first and second faces; and a metal stiffener extending along the outer edge of the printed circuit board without extending beyond the outer edge in a direction away from the printed circuit board.

11. The apparatus of claim 10, wherein the metal stiffener extends into a keep out area of printed circuit board.

12. The apparatus of claim 11, wherein the metal stiffener extends through a full width of the keep out area.

13. The apparatus of claim 10, wherein the metal stiffener is exposed along the outer edge of the printed circuit board.

14. The apparatus of claim 10, including an adhesive between the metal stiffener and the outer edge of the printed circuit board.

15. The apparatus of claim 14, wherein the adhesive is conductive.

16. The apparatus of claim 10, wherein the stiffener is spaced apart from IO routing metal within the printed circuit board.

17. The apparatus of claim 10, wherein the stiffener is electrically coupled to a ground ring that surrounds electrical circuits within the printed circuit board.

18. A method comprising:

combining initial buildup layers for a printed circuit board, the initial buildup layers having a first thickness; and attaching a stiffener along a perimeter of the printed circuit board, the stiffener having a second thickness, the second thickness corresponding to the first thickness.

19. The method of claim 18, including adding additional buildup layers over the initial buildup layers and over the stiffener, the stiffener positioned between ones of the additional buildup layers.

20. The method of claim 18, including removing a keep out zone along the perimeter of the printed circuit board before attaching the stiffener, the stiffener to be attached to a location where the keep out zone was removed.

21. The method of claim 18, including adding metal vias to electrically couple the stiffener.

* * * * *